US009627254B2

(12) United States Patent
Burgess et al.

(10) Patent No.: US 9,627,254 B2
(45) Date of Patent: Apr. 18, 2017

(54) METHOD FOR BUILDING VERTICAL PILLAR INTERCONNECT

(71) Applicant: FlipChip International, LLC, Phoenix, AZ (US)

(72) Inventors: Guy F. Burgess, Gilbert, AZ (US); Anthony P. Curtis, Queen Creek, AZ (US); Eugene A. Stout, Phoenix, AZ (US); Theodore G. Tessier, Chandler, AZ (US); Lillian C. Thompson, Phoenix, AZ (US)

(*) Notice: Subject to any disclaimer, the term of this patent is extended or adjusted under 35 U.S.C. 154(b) by 527 days.

(21) Appl. No.: 13/826,987

(22) Filed: Mar. 14, 2013

(65) Prior Publication Data

US 2013/0196499 A1 Aug. 1, 2013

Related U.S. Application Data

(63) Continuation-in-part of application No. 12/828,003, filed on Jun. 30, 2010, now abandoned.
(Continued)

(51) Int. Cl.
*H01L 21/44* (2006.01)
*H01L 21/768* (2006.01)
(Continued)

(52) U.S. Cl.
CPC ........ *H01L 21/76838* (2013.01); *H01L 24/11* (2013.01); *H01L 21/563* (2013.01);
(Continued)

(58) Field of Classification Search
CPC ......... H01L 24/10; H01L 24/11; H01L 24/12; H01L 24/13; H01L 24/14; H01L 24/15;
(Continued)

(56) References Cited

U.S. PATENT DOCUMENTS 5,828,128 A 10/1998 Higashiguchi et al.
6,592,019 B2 7/2003 Tung
(Continued)

FOREIGN PATENT DOCUMENTS

EP 0655779 5/1995
EP 1239514 A2 9/2002
(Continued)

OTHER PUBLICATIONS

Tie Wang, et al., "Studies on a Novel Flip-Chip Interconnect Structure—Pillar Bump," Advanpack Solutions Pte Ltd Presentation, Electronic Components and Technology Conference, 2001. Proceedings., 51st, pp. 945-949. Guy Burgess & Joan Vrtis, "Low Void Solder Pastes for FlipChip Applications," 2005 IMAPS Int'l Device Packaging Conference, Jun. 23, 2005.
(Continued)

*Primary Examiner* — Thanh Y Tran

(57) ABSTRACT

An exemplary method includes forming a vertical pillar overlying or laterally displaced from a bond pad overlying a semiconductor substrate, and applying a discrete solder sphere in combination with one of a solder paste or flux on a top surface of the pillar, wherein the one of the solder paste or flux is defined by at least one photoresist layer. The method may include applying a solder sphere and/or solder flux in different combinations on top surfaces of different first and second pillars.

31 Claims, 8 Drawing Sheets

Related U.S. Application Data

(60) Provisional application No. 61/222,839, filed on Jul. 2, 2009.

(51) Int. Cl.
*H01L 21/56* (2006.01)
*H01L 23/00* (2006.01)

(52) U.S. Cl.
CPC ............. *H01L 24/02* (2013.01); *H01L 24/03* (2013.01); *H01L 24/05* (2013.01); *H01L 24/13* (2013.01); *H01L 24/16* (2013.01); *H01L 2224/023* (2013.01); *H01L 2224/02311* (2013.01); *H01L 2224/02313* (2013.01); *H01L 2224/0345* (2013.01); *H01L 2224/0361* (2013.01); *H01L 2224/03464* (2013.01); *H01L 2224/03912* (2013.01); *H01L 2224/0401* (2013.01); *H01L 2224/119* (2013.01); *H01L 2224/1132* (2013.01); *H01L 2224/1147* (2013.01); *H01L 2224/1181* (2013.01); *H01L 2224/1184* (2013.01); *H01L 2224/11334* (2013.01); *H01L 2224/11462* (2013.01); *H01L 2224/11464* (2013.01); *H01L 2224/11474* (2013.01); *H01L 2224/11505* (2013.01); *H01L 2224/11849* (2013.01); *H01L 2224/11901* (2013.01); *H01L 2224/11903* (2013.01); *H01L 2224/133* (2013.01); *H01L 2224/13024* (2013.01); *H01L 2224/13082* (2013.01); *H01L 2224/13083* (2013.01); *H01L 2224/13101* (2013.01); *H01L 2224/13111* (2013.01); *H01L 2224/13116* (2013.01); *H01L 2224/13117* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13294* (2013.01); *H01L 2224/13339* (2013.01); *H01L 2224/16225* (2013.01); *H01L 2224/16227* (2013.01); *H01L 2224/73204* (2013.01); *H01L 2224/8184* (2013.01); *H01L 2224/81191* (2013.01); *H01L 2224/81815* (2013.01); *H01L 2224/831* (2013.01); *H01L 2924/014* (2013.01); *H01L 2924/01013* (2013.01); *H01L 2924/01029* (2013.01); *H01L 2924/01033* (2013.01); *H01L 2924/01046* (2013.01); *H01L 2924/01047* (2013.01); *H01L 2924/01049* (2013.01); *H01L 2924/01051* (2013.01); *H01L 2924/01075* (2013.01); *H01L 2924/01078* (2013.01); *H01L 2924/01079* (2013.01); *H01L 2924/01082* (2013.01); *H01L 2924/12042* (2013.01); *H01L 2924/381* (2013.01)

(58) Field of Classification Search
CPC ... H01L 24/16; H01L 24/17; H01L 23/49816; H01L 24/30; H01L 24/33; H01L 23/3128
USPC ....... 257/737, 738, 779, 780, 781, 782, 783, 257/784, 734; 438/612, 613, 614
See application file for complete search history.

(56) References Cited

U.S. PATENT DOCUMENTS

| | | | |
|---|---|---|---|
| 6,681,982 B2 | 1/2004 | Tung | |
| 6,732,913 B2 | 5/2004 | Alvarez | |
| 7,220,657 B2 * | 5/2007 | Ihara | H01L 24/11 257/E21.508 |
| 8,209,856 B2 * | 7/2012 | Mori | H01L 21/4853 29/829 |
| 8,252,677 B2 * | 8/2012 | Bchir et al. | 438/612 |
| 8,741,737 B2 * | 6/2014 | Popa | B23K 35/262 438/455 |
| 2002/0093091 A1 * | 7/2002 | Huang | H01L 23/36 257/706 |
| 2003/0006062 A1 * | 1/2003 | Stone | H01L 24/11 174/255 |
| 2003/0096494 A1 | 5/2003 | Sakuyama et al. | |
| 2003/0134233 A1 * | 7/2003 | Su | H01L 24/11 430/318 |
| 2003/0211427 A1 * | 11/2003 | Tseng | H01L 21/67086 430/329 |
| 2004/0127010 A1 * | 7/2004 | Chen | H01L 24/11 438/612 |
| 2004/0185649 A1 | 9/2004 | Huang | |
| 2004/0226745 A1 * | 11/2004 | En | C25D 3/38 174/262 |
| 2005/0205993 A1 * | 9/2005 | Yamaguchi | H01L 23/3114 257/738 |
| 2006/0088992 A1 * | 4/2006 | Huang | H01L 24/11 438/614 |
| 2006/0094224 A1 | 5/2006 | Huang et al. | |
| 2006/0094226 A1 | 5/2006 | Huang et al. | |
| 2006/0159885 A1 * | 7/2006 | Shirai | H05K 3/421 428/131 |
| 2007/0090160 A1 * | 4/2007 | Masumoto | B23K 35/0244 228/101 |
| 2007/0269973 A1 * | 11/2007 | Nalla | H01L 24/11 438/612 |
| 2009/0130838 A1 * | 5/2009 | Sakaguchi | H01L 21/4853 438/613 |
| 2009/0229120 A1 * | 9/2009 | Taniguchi | H01L 21/4853 29/829 |
| 2009/0298277 A1 * | 12/2009 | MacKay | H01L 24/03 438/613 |
| 2010/0044084 A1 * | 2/2010 | Lee | H01L 21/4853 174/257 |
| 2010/0143656 A1 * | 6/2010 | Zu | B23K 3/0638 428/172 |
| 2011/0049706 A1 * | 3/2011 | Huang | H01L 24/81 257/737 |
| 2011/0079926 A1 * | 4/2011 | Chung | H01L 21/4853 257/778 |
| 2011/0278716 A1 * | 11/2011 | Hsu | H01L 24/11 257/737 |

FOREIGN PATENT DOCUMENTS

| | | |
|---|---|---|
| EP | 1387402 | 2/2004 |
| KR | 1020070036531 | 4/2007 |

OTHER PUBLICATIONS

Joan Vrtis, "FlipChip International, LLC Services/Products," 2005 Semicon West Conference, Jul. 2005.
Joan Vrtis, "FlipChip International, LLC Overview," 2005 Semicon West Conference, Jul. 2005.
Guy Burgess, "SAC Low Voiding Pb-Free Solder Paste Optimization," 2006 IMAPS Int'l Device Packaging Conference, Mar. 21, 2006.
O.S. Kessling, et al. "Solder bumping for ftip-chips with an electromagnetic actuator", 2008 2nd Electronics System Integration Technology Conference, Sep. 1, 2008, pp. 981-984.
Supplementary European Search Report mailed May 15, 2013 for Application No. PCT/US2010/040410; 14 sheets.
International Search Report and Written Opinion mailed Feb. 8, 2011 for Application No. PCT/US2010/040410; 9 sheets.
Asen Long Xin Jiang et al., "Pillar Bump Technology and Integrated Embedded Passive Devises" in 7th Int'l. Conference on Electronics Packaging Technology 2006, IEEE, Aug. 2006, pp. 1-5.
Machine Translation of Korean Published Patent Application No. 10-2007-0036531.

* cited by examiner

METHOD FOR BUILDING VERTICAL PILLAR INTERCONNECT

CROSS REFERENCE TO RELATED APPLICATIONS

This application is a continuation In part of U.S. patent application Ser. No. 12/828,003, filed Jun. 30, 2010, entitled Methods And Structures For A Vertical Pillar Interconnect, which claims the benefit of priority of U.S. Provisional patent application Ser. No. 61/222,839, filed Jul. 2, 2009, the disclosures of which are hereby incorporated by reference in their entirety.

FIELD

The present disclosure generally relates to a structure and method for semiconductor devices, and more particularly to a structure and method for electronic wafer-level chip-scale packaging and flip-chip packaging and assembly.

BACKGROUND

Copper pillar bumps, which are one type of vertical interconnect technology, can be applied to semiconductor chips or other microelectronic device bond pads via copper pillar bumping technologies that are known to those familiar with the art. The copper pillar bumps are placed on the chips/devices while the chips/devices are still in their wafer form. All solder-based flip-chip and/or chip scale package (CSP) style interconnects (bumps) require suitable under bump metallurgy (UBM) to act as adhesion layers/diffusion barriers between the wafer/substrate metallization and the solder bump itself. Pillar bumps (copper, gold, or other metals/alloys) have the potential to be used as functional UBMs, provided that reliable/manufacturable methods are used to form the solder bumps on wafers.

A copper pillar bump offers a rigid vertical structure when compared to a typical solder bump or CSP interconnect. In applications where control of the stand-off between two surfaces, such as a device and its associated substrate, is required, the copper pillar bump acts as a fixed standoff to control that distance, while the solder performs the joint connection between the two surfaces. Controlling this stand-off is critical to overall system performance and reliability. Copper pillar bump structures also offer improved thermal transfer and resistivity compared to equivalent flipchip or CSP solder bump stand-offs. Use of preformed solder spheres increases overall solder volume in the joint, thereby enhancing joint connection strength.

Cu pillar bump structures have the potential to be a cost-effective, reliable interconnect option for certain markets in the microelectronics industry. However, reliable and low cost manufacturable methods are needed for building versatile fixed stand-off bump structures. Most pillar bump manufacturing methods use a photo-definable mask material to electroplate the pillar structure followed by an electroplated solder. Plating the solder is a slow, expensive process that requires considerable process control and strictly limits the solder to a common binary alloy. Typically, electroplating more than a binary solder alloy to form the solder portion of the pillar bump is very difficult to control in a manufacturing environment. In the semiconductor industry however, using various multiple element alloys or alloys doped with trace elements are desirable to improve the reliability of the interconnect.

SUMMARY OF THE DISCLOSURE

The present disclosure provides an enhanced solder based wafer bumping technology with variable height underbump metallizations (UBM), thereby providing a functional vertical interconnect structure that can be used to connect a semiconductor chip or other microelectronic device to a circuit board, or other substrate for use in 2D and 3D packaging solutions.

An exemplary method in accordance with the present disclosure includes forming a vertical pillar overlying or laterally displaced from, yet electrically connected to, a bond pad overlying a semiconductor substrate, and applying a discrete solder sphere in combination with one of a solder paste or flux on a top surface of the pillar, wherein the one of the solder paste or flux is defined by at least one photoresist layer, or an overlying metal stencil. Preferably the pillar is defined by the at least one photoresist layer. In one embodiment the at least one photoresist layer has a first aperture to define the solder paste or flux, the pillar is defined by a second aperture in an additional photoresist layer. In one embodiment the at least one photoresist layer is formed overlying the additional photoresist layer and the first aperture has a greater lateral dimension than the second aperture.

Another exemplary embodiment of a method in accordance with the present disclosure includes forming first and second vertical pillars each overlying a respective bond pad, wherein the respective bond pad overlies a semiconductor substrate, forming at least one photoresist layer having a first aperture and a second aperture, applying a solder sphere and solder flux or solder paste on a top surface of each of the first and second pillars, wherein the solder sphere and solder flux or paste on the first pillar is defined by the first aperture and the solder on the second pillar is defined by the second aperture, and performing a reflow to form a first solder cap on the first pillar and a second solder cap on the second pillar, wherein the combined height of the first pillar and first solder cap is greater than the combined height of the second pillar and second solder cap. In one embodiment the at least one photoresist layer is a single photoresist layer or a multi-layer photoresist stack. In one embodiment the combined height of the first pillar and first solder cap is greater than the combined height of the second pillar and second solder cap by at least about 5 microns.

Still another exemplary embodiment of a method in accordance with the present disclosure includes forming a vertical pillar having a height less than that in an exemplary method, said pillar overlying or laterally displaced from, yet electrically connected to, a bond pad overlying a semiconductor substrate, and applying a solder sphere/flux mixture using printing methods, into an opening defined by at least one photoresist layer.

Completion of the above referenced embodiments is done by heating of the solder to at or near melting temperatures.

BRIEF DESCRIPTION OF THE DRAWINGS

For a more complete understanding of the present disclosure, reference is now made to the following figures.

DETAILED DESCRIPTION

Figure 1:
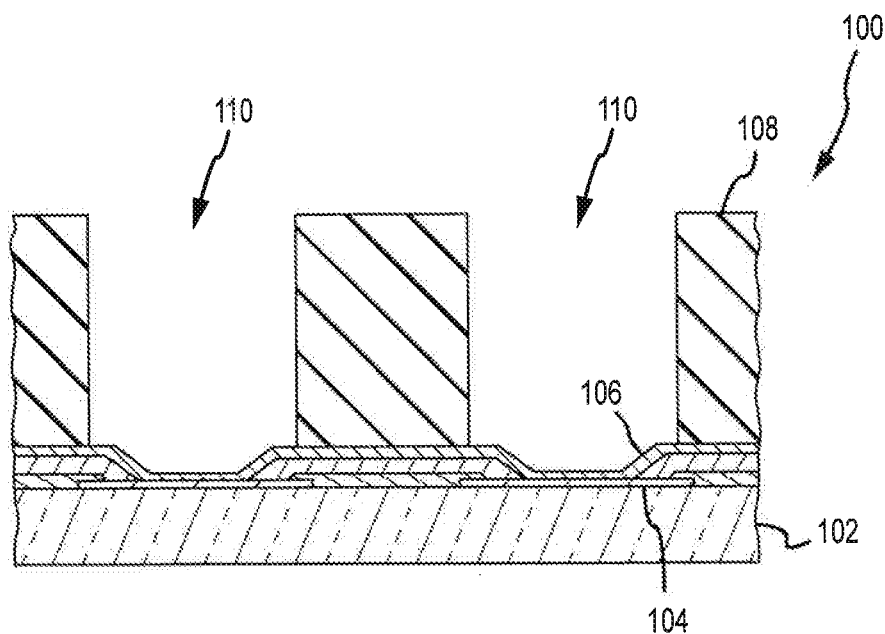
FIG. 1 illustrates a cross-sectional view of a portion of a wafer 100 substrate 102 with I/O bond pads 104. This view also shows the deposited plating seed layer 106 and the dual purpose photoresist masking material 108 following exposure and develop. This forms the necessary apertures 110 for the copper plating, flux dispense, solder paste print and solder sphere placement processes.

The present disclosure provides an enhanced solder based wafer bumping technology with variable height underbump metallizations (UBM), thereby providing a functional vertical interconnect structure that can be used to connect a semiconductor chip or other microelectronic device to a circuit board, or other substrate for use in 2D and 3D packaging solutions. Copper pillar bumps, as one type of vertical interconnect technology, can be applied to semiconductor chips or other microelectronic device bond pads via copper pillar bumping technologies that are known to those familiar with the art. The copper pillar bumps can be placed on the chips/devices while the chips/devices are still in wafer form. All solder based flip chip and/or CSP style interconnects (bumps) require suitable under bump metallurgy (UBM) to act as adhesion layers/diffusion barriers between the wafer/substrate metallization and the solder bump itself. Pillar bumps (copper, gold, Pd or other metals/alloys) have the potential to be used as functional UBMs, provided reliable/manufacturable methods are used to form solder bumps on wafers.

A reliable and manufacturable method for forming solder caps on vertical pillar structures is disclosed. The method in accordance with this disclosure provides a means to significantly simplify the manufacturing flow and reduce the cost of manufacturing vertical interconnection structures by the use of a dual purpose photoresist process, which serves as a plating mold, solder paste and/or flux vessel, and solder sphere in-situ stencil template. The present disclosure also includes a method of printing various solder pastes atop a vertical pillar structure, and in other embodiments, placement of preformed solder spheres of varying compositions, atop a dispensed flux or paste, followed by a subsequent reflow to form the solder cap. Furthermore, the present disclosure includes formation of capped vertical pillar structures of differing heights and with differing sphere cap compositions.

The method of using solder pastes and/or preformed solder spheres in accordance with this disclosure may also include using various multiple-element alloys and trace elements within the solder paste and/or spheres that can enhance the reliability or performance of the solder cap. These methods apply to copper pillar bump-like structures and other vertical interconnection schemes of various sizes and shapes including but not limited to the following metals: Copper and its alloys, Gold and its alloys, Aluminum and its alloys, Silver and its alloys, Palladium and its alloys. The pillar may also include a solder wettable cap finish including but not limited to Ni, NiAu, NiPdAu, NiPd, Pd, NiSn.

These methods can be used to build Cu pillar bump structures positioned atop or laterally displaced from an I/O bond pad, yet maintaining electrical connection. Because the methods described herein employ a printed solder paste and/or preformed solder sphere, an end product can be produced with a much broader range of solder alloys than the existing method of using a plated solder.

In the method in accordance with this disclosure the solder paste portion of the pillar bump includes but is not limited to the following alloys/metals: SnPb alloys, SnPbCu alloys, SnAgCu alloys, SnNiAgCu alloys, AuSn alloys, AuSi alloys, SnSb alloys, SnSbBi alloys, PbSnSb alloys, PbSnSb alloys, PbIn alloys, PbSnAg alloys, SnAg alloys, PbSb alloys, SnInAg alloys, SnCu alloys, PbAg alloys, SnAs alloys, PbSbGa alloys, SnAs alloys, SnGe alloys, ZnAl alloys, CdAg alloys, GeAl alloys, AuIn alloys, AgAuGe alloys, AlSi alloys, AlSiCu alloys, AgCdZnCu alloys, and AgCuZnSn alloys. This method also can include any solder sintering alloys deposited in the "in situ" aperture such as Ag sintering material.

Because the method in accordance with this disclosure employs a printed solder paste and/or preformed solder sphere, it offers the option for an end product with various trace elements in the solder including, but not limited to; Bi, Ni, Sb, Fe, Al, Ag, Cu, Sn, In, and Pb. The resulting pillar and solder cap structure using the methods disclosed herein can have a preferred overall height ranging between 5 and 400 microns and a preferred pitch as low as 10 microns. Furthermore, the x and y dimensional limits of the pillars produced using these methods can have pillars as small as 5 um and up to 2 mm.

An exemplary embodiment of a method in accordance with this disclosure for forming solder bumps using solder paste and/or preformed solder spheres or combinations of solder paste and preformed solder spheres on vertical interconnect structures with various iterations proceeds as follows:

Without Redistribution:

Step 1. A seed layer of metal is deposited on a wafer/substrate by a conventional method such as sputtering, evaporation, electroless plating, immersion plating, etc. to provide a continuous seed layer on the wafer/substrate for plating.

Step 2. A photoresist layer or other resist type material is applied over the entire surface of the wafer/substrate. This can be achieved by dry film lamination, spin or spray coating methods.

Step 3. Apertures are then formed through the photoresist layer. The photoresist layer is generally defined by UV exposure through an appropriate photomask based on the design, but the creation of the aperture is not limited to UV exposure/develop and might include but is not limited to laser ablation, dry etch, or lift-off processes.

For alternate configurations of this method, multiple layers of photoresist materials or other resist type materials can be applied to form varied aperture heights and aperture sizes within the same resist stack that can facilitate varied columnar structures and varied solder volumes deposited on top of the columnar structure.

Step 4. The photoresist layer(s) covering the seed layer is developed, or otherwise opened, forming open "in-situ" apertures for the plating of the pillar or columnar structure and subsequent solder paste printing, flux deposition or preformed solder sphere placement. The overall depth of the "in-situ" apertures can range between 2-200 um.

Step 5. Pillar structures are preferably electroless or electroplated onto the seed metal layer surface in the apertures formed in the photoresist layer(s).

Figure 6:
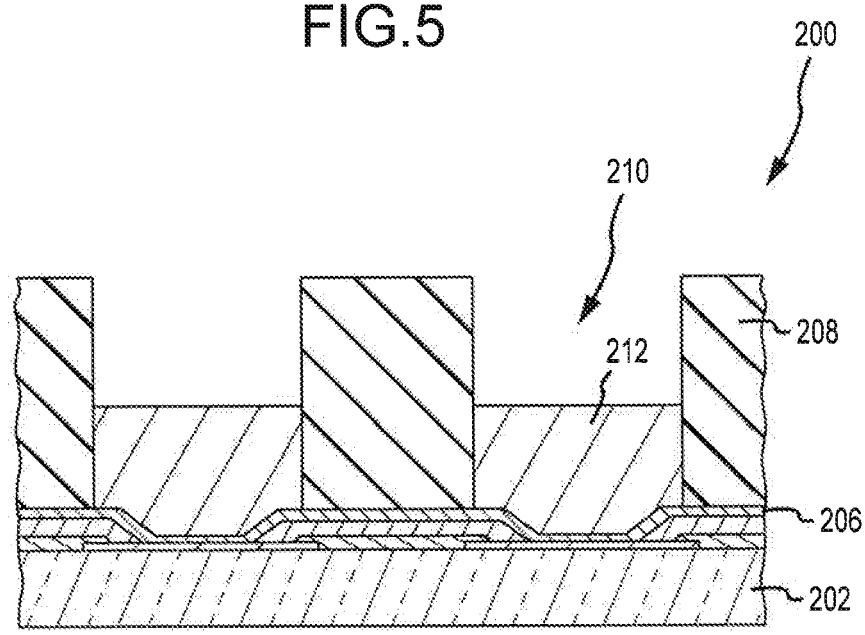
FIG. 6 illustrates a cross sectional view of a wafer 200 during an alternate process for filling the apertures 210 with flux 214 and preformed solder spheres 216 using stencil printing methods.

Step 6. Solder paste is printed into the "in-situ" apertures in the photoresist stencil with the solder paste covering the top of the copper pillars; alternatively, flux is applied into the "in-situ" apertures in the photoresist stencil, followed by placement of preformed solder spheres using technology known to those skilled in the art. Furthermore, solder flux and preformed solder spheres together may be applied into or atop the "in-situ" apertures. This can result in capped pillars of different heights as may be called for in different applications. An alternate method for depositing preformed spheres uses stencil printing technology to direct the sphere/flux mixture into the designated apertures, as shown in FIG. 6. Alternatively, a metal stencil could also be used to further define the area where solder paste or flux can be applied over the pillar bump structure both in and above the "in-situ" photoresist material, or to maintain positional accuracy of the preformed solder spheres prior to reflow.

Step 7. The wafer or other substrate with printed solder, and/or solder sphere preforms in place is then reflowed and cooled, forming solder caps on top of the copper pillar columns.

Step 8. The "in-situ" photoresist stencil material is stripped away or otherwise removed.

Step 9. The un-plated seed layer is selectively etched away leaving behind individual pillars capped with solder.

Step 10. A second reflow operation may be performed on the wafer or other substrate to optimize the bump shape. Also, a coining or flattening process can be used to further reduce bump to bump resolution beyond that possible with Cu pillar technology developed as part of the prior art.

With Redistribution:

Step 1. A dielectric layer or other resist type material is applied over the entire surface of the wafer/substrate. This can be achieved by dry film lamination, spin or spray coating methods.

Step 2. Apertures are then formed through the dielectric layer corresponding to bond pad locations, and thus exposing underlying bond pad structures. The dielectric layer is generally defined by UV exposure through an appropriate photomask based on the design, but the creation of the aperture is not limited to UV exposure/develop and might include but is not limited to laser ablation, dry etch, or lift-off processes.

Step 3. A redistribution layer of metal is formed and patterned on the dielectric layer by either subtractive or removal patterning methods or semi-additive, plating techniques. Conventional methods such as sputtering, evaporation, electroless plating, immersion plating, etc. may be used to provide a continuous layer on the wafer/substrate for plating.

Step 4. A second dielectric layer is applied over the entire surface of the wafer/substrate. This can be achieved by dry film lamination, spin or spray coating methods.

Step 5. Apertures are then formed through the dielectric layer, overlying the RDL metallization layer and corresponding to the final pillar bump locations. The dielectric layer is generally defined by UV exposure through an appropriate photomask based on the design, but the creation of the aperture is not limited to UV exposure/develop and might include but is not limited to laser ablation, dry etch, or lift-off processes.

Step 6. Under bump metallization (UBM) layer/s are deposited via sputtering, evaporation, electroless plating, immersion plating, etc. into the aperture, atop the second dielectric layer.

Step 7. A photoresist layer is applied over the entire surface of the wafer/substrate. This can be achieved by dry film lamination, spin or spray coating methods.

For alternate configurations of this method, multiple layers of photoresist materials or other resist type materials can be applied to form varied aperture heights and aperture sizes within the same resist stack that can facilitate varied columnar structures and varied solder volumes deposited on top of the columnar structure.

Step 8. The photoresist layer(s) covering the dielectric layer is developed, or otherwise opened, forming open "in-situ" apertures for the plating of the pillar or columnar structure and subsequent solder paste printing, flux deposition or preformed solder sphere placement. The overall depth of the "in-situ" apertures can range between 2-200 um.

Step 9. Pillar structures are preferably electroless or electroplated onto the UBM metal layer surface in the apertures formed in the photoresist layer(s).

Step 10. Solder paste is printed into the "in-situ" apertures in the photoresist stencil with the solder paste covering the top of the copper pillars after which preformed solder spheres may be placed into the paste; alternatively, flux is applied into the "in-situ" apertures in the photoresist stencil, followed by placement of preformed solder spheres using technology known to those skilled in the art. Furthermore, solder flux and preformed solder spheres together may be applied into or atop the "in-situ" apertures. This can result in capped pillars of different heights as may be called for in different applications. An alternate method for depositing preformed spheres uses stencil printing technology to direct the sphere/flux mixture into the designated apertures, as shown in FIG. 6. Alternatively, a metal stencil could also be used to further define the area where solder paste or flux can be applied over the pillar bump structure both in and above the "in-situ" photoresist material, or to maintain positional accuracy of the preformed solder spheres prior to reflow.

Step 11. The wafer or other substrate with printed solder, and/or solder sphere preforms in place is then reflowed and cooled, forming solder caps on top of the copper pillar columns.

Step 12. The "in-situ" photoresist stencil material is stripped away or otherwise removed.

Step 13. The UBM layer is selectively etched away leaving behind individual pillars capped with solder.

Step 14. A second reflow operation may be performed on the wafer or other substrate to optimize the bump shape. Also, a coining or flattening process can be used to further reduce bump to bump resolution beyond that possible with Cu pillar technology developed as part of the prior art.

Steps 1-10 and steps 1-14 above are all performed using processing methods and tool sets known to those experienced in the art with photo-imaging, plating, and solder bumping processes.

One example of the method according to the present disclosure is shown with reference to FIGS. 1-5. In FIG. 1, a cross sectional view of a portion of a wafer 100 is shown that has a substrate 102 with I/O bond pads 104 thereon. This view also shows the deposited plating seed layer 106 and the dual purpose photoresist masking material 108 following exposure and develop operations. The patterned masking material 108 forms the necessary apertures 110 for the copper plating, flux dispense, solder paste print and solder sphere placement processes that follow.

Figure 2:
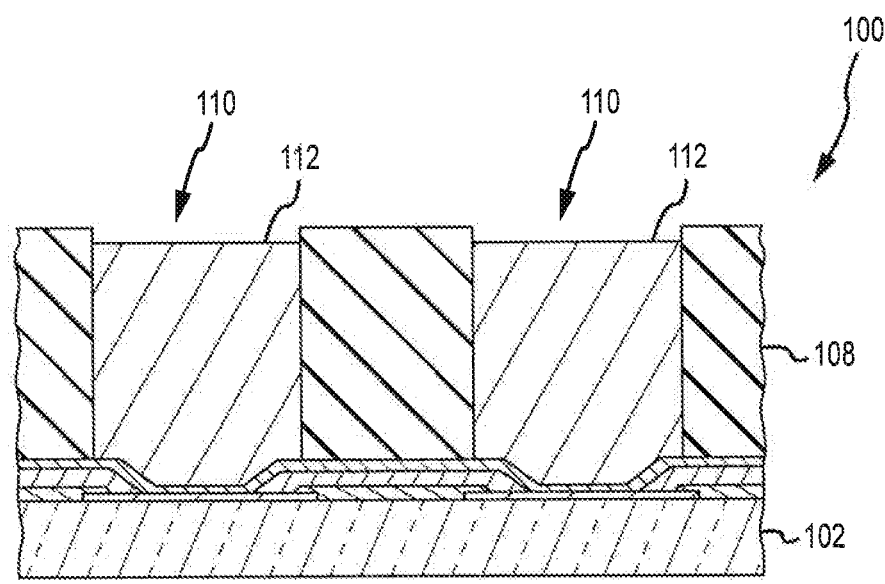
FIG. 2 illustrates the cross-sectional view of the wafer 100 shown in FIG. 1 following copper plating of the pillar 112 with the upper portion of the aperture 110 which may be reserved for flux 114 deposition.

FIG. 2 illustrates the cross sectional view of the wafer 100 shown in FIG. 1 following copper plating of the pillar 112 with the upper portion of the aperture 110.

Figure 3:
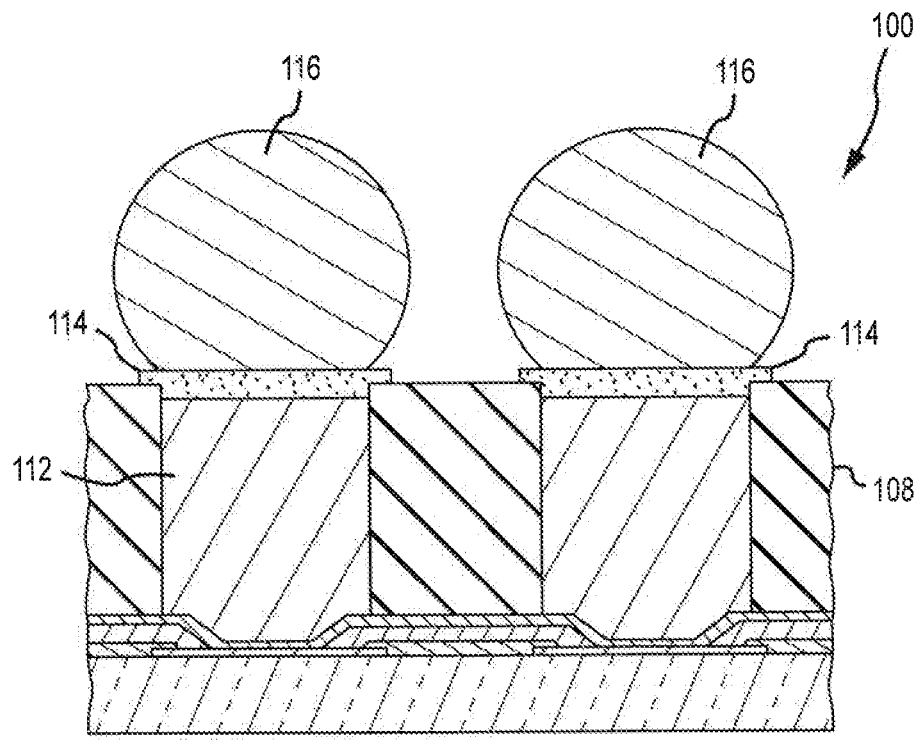
FIG. 3 illustrates the cross-sectional view of the wafer 100 shown in FIG. 2 after the deposition of the flux 114 into the resist apertures 110 and placement of solder spheres 116 upon the flux 114. This affords the use of multi-element solder alloys with options of various trace elements to improve the reliability of the solder.

Next, a layer of solder paste or flux 114 is squeegeed into the apertures 110. Then a solder sphere 116 is placed on the solder paste or flux 114 as is shown in FIG. 3.

Figure 4:
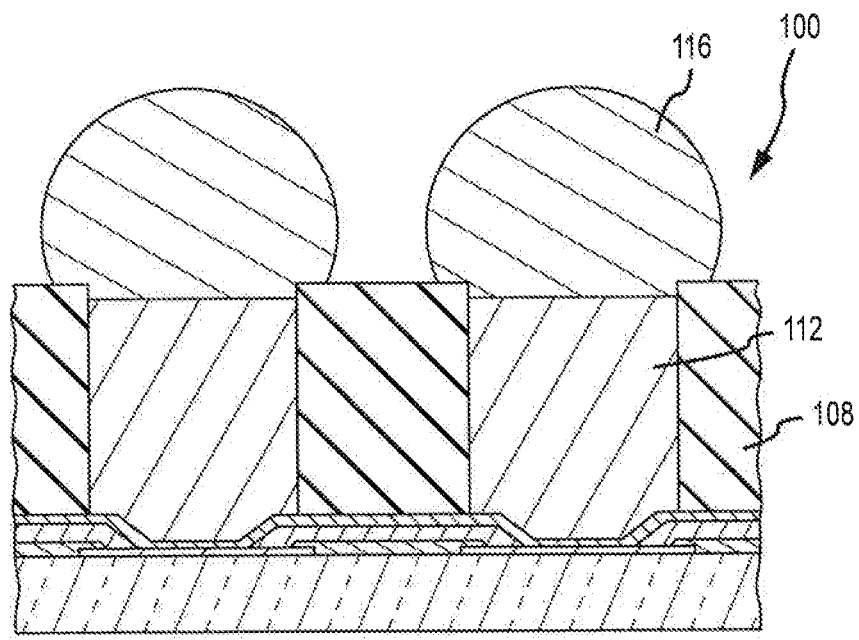
FIG. 4 illustrates the cross-sectional view of the wafer 100 shown in FIG. 3 following solder reflow where the solder spheres 116 have formed hemisphere like solder bumps on top of the Cu pillars 112.
Figure 5:
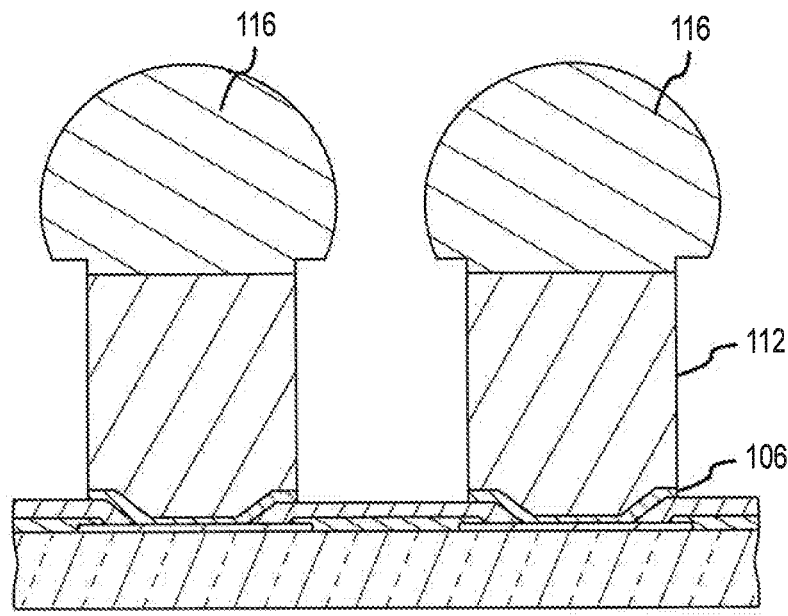
FIG. 5 illustrates the cross-sectional view of the completed wafer 100 following the strip removal of the photoresist material 108 and the etch removal of the non-pillar plated seed layer 106.

Next a reflow operation is performed heating the solder spheres so that they deform plastically as is shown in FIG. 4 such that they form generally hemispherical caps on top of the pillars 112. Following the reflow operation, the photoresist material 108 is removed and the seed layer 106 is etched to remove the exposed seed layer 106 adjacent the pillars 112, leaving the capped pillars 112 as shown in FIG. 5.

Figure 7:
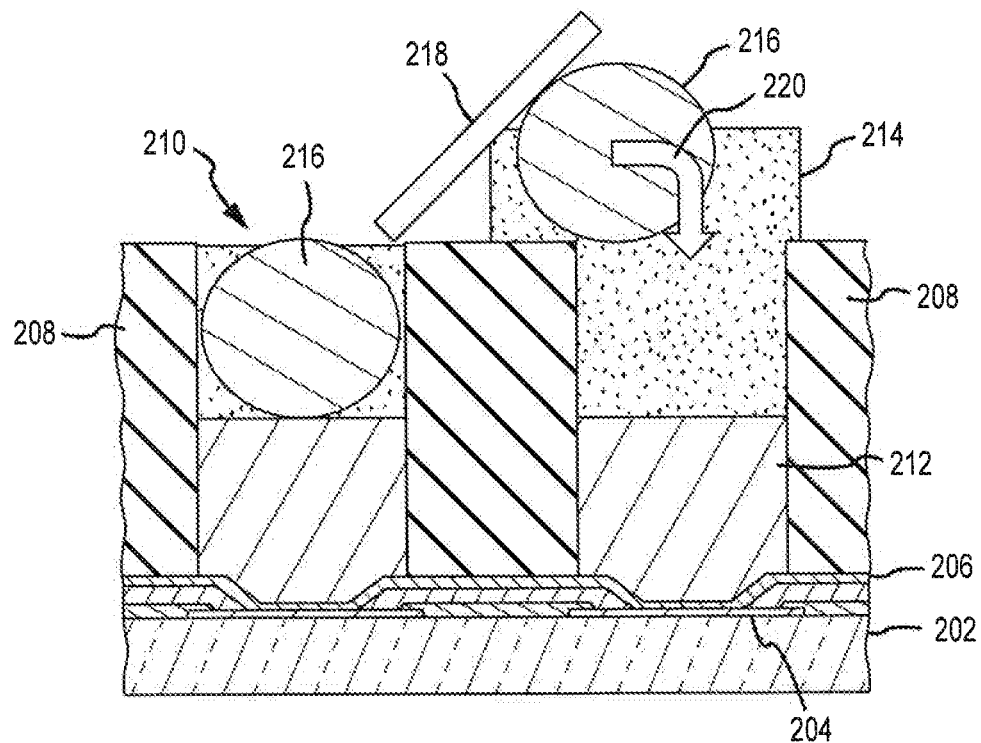
FIG. 7 illustrates deposition of solder flux 214 and scraping of preformed solder spheres 216 into apertures 210 in the photoresist 208 in this alternative.

An alternate configuration is shown in FIGS. 6-9 formed utilizing the method in accordance with the present disclosure. FIG. 6 illustrates a cross sectional view of a wafer 200 during this alternate process for filling the apertures 210 with flux 214 and solder spheres 216 using stencil printing methods. The wafer 200 again has a substrate 202 and bond pads 204 overlying the substrate 102. A seed layer 206 overlies the bond pads 104. In this embodiment, deposition of the plated copper 212 is only done to a lesser depth than in the embodiment illustrated in FIGS. 1-5. FIG. 7, in this second embodiment, shows deposition of solder flux 214 and solder spheres 216 together into the spaces above the copper pillars 212 below the upper edges of the photoresist 208. A squeegee 218 is used to push the spheres 216 in direction 220 into the recessed spaces above the pillars 212.

Figure 8:
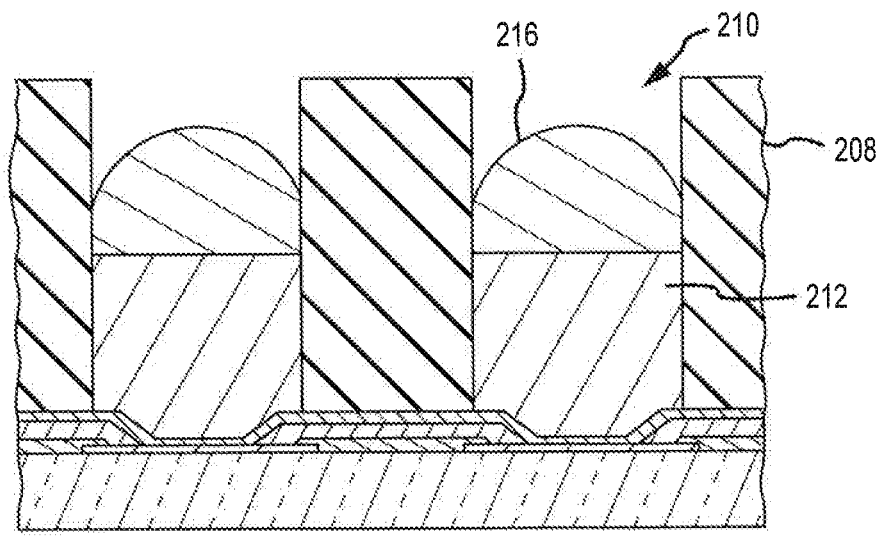
FIG. 8 illustrates the wafer 200 shown in FIGS. 6 and 7 after reflow of the flux and preformed spheres to form hemispherical pillar caps.
Figure 9:
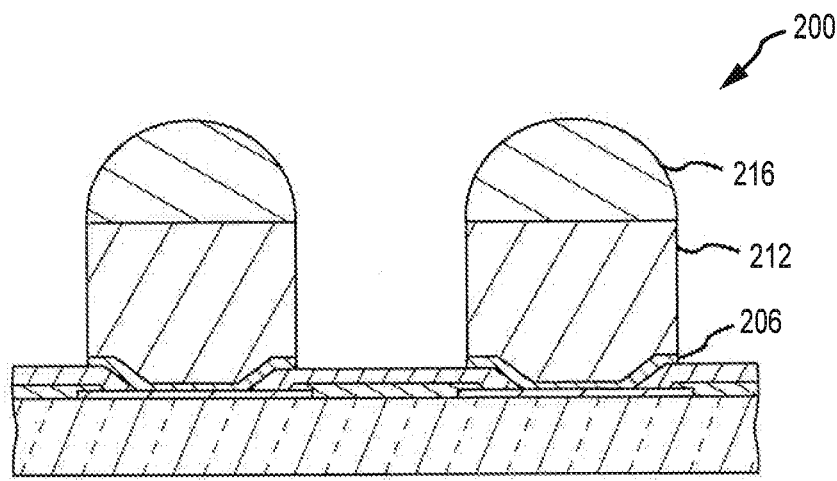
FIG. 9 illustrates the same wafer 200 after resist and seed layer strip operations.

FIG. 8 shows the wafer 200 following a reflow operation to form the solder spheres 216 into hemispherical caps on the pillars 212. Then, as is shown in FIG. 9, the photoresist 208 is removed and the seed layer 206 etched away as was done previously with reference to FIGS. 1-5.

Figure 10:
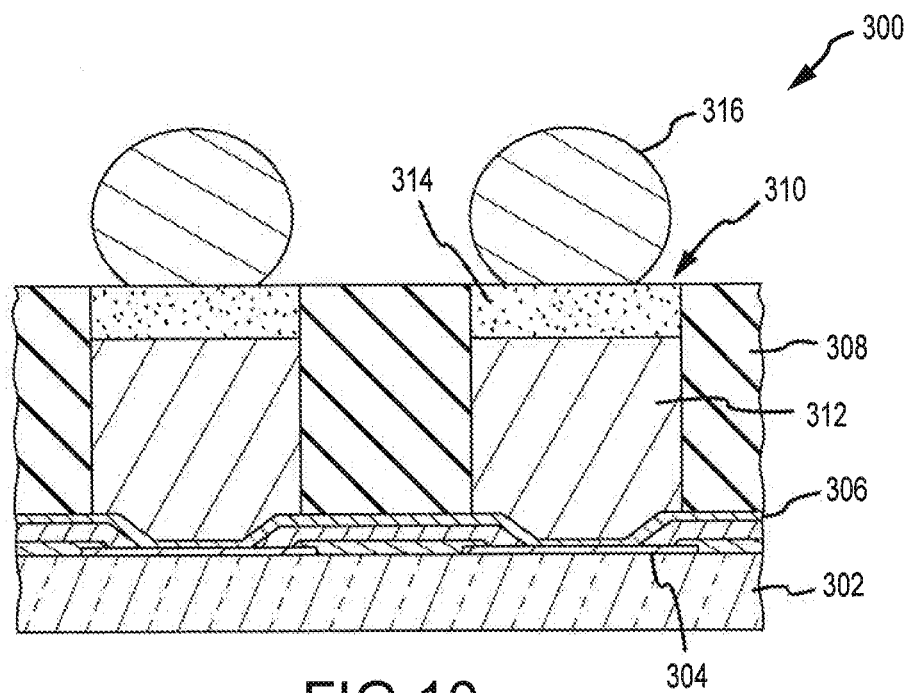
FIG. 10 illustrates a wafer 300 formed by another alternate process where the apertures 310 may be partially filled with plated Cu, followed by solder paste 314 deposition atop the pillars 312 which may fill the openings, then placement of solder spheres 316 atop the paste 314 to create greater solder volume.
Figure 11:
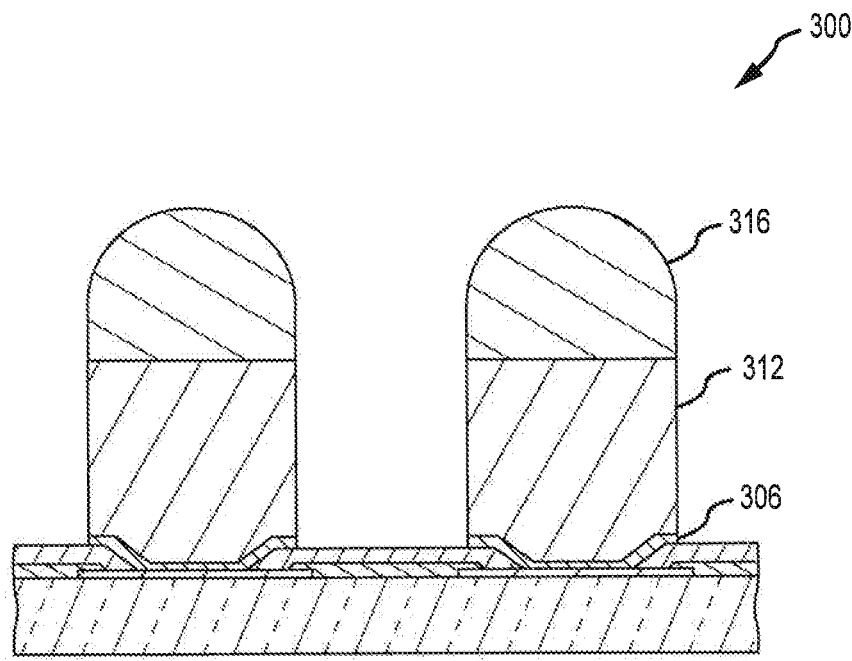
FIG. 11 illustrates the embodiment shown in FIG. 10 after reflow, resist and seed layer removal.
Figure 12:
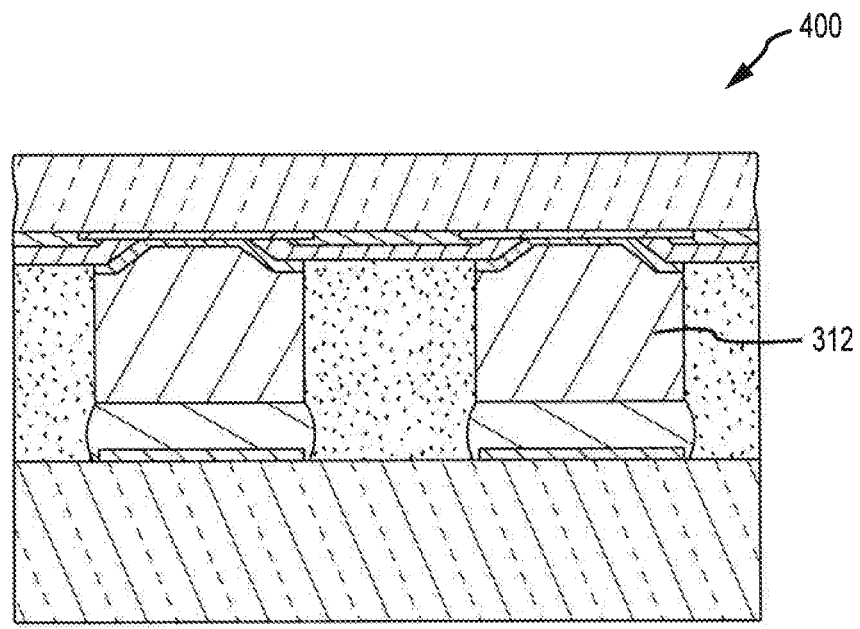
FIG. 12 illustrates a cross-sectional view of an assembled structure including the Cu pillar bumps with a corresponding board or other substrate.

FIGS. 10 and 11 illustrate another alternate process in which the apertures are filled with plated copper, followed by solder paste deposition, then placement of solder spheres atop the paste to create greater solder cap volume. As is shown in FIG. 10, wafer 300 has, similar to that shown in FIGS. 1-9, a substrate 302, bond pads 304, seed layer 306, and patterned photoresist 308 defining apertures 310 into which copper pillars 312 are plated so as to fill a portion of the apertures 310. Then a solder paste 314 that may include a flux material, is applied into the apertures 310, or into apertures in an overlying metal stencil (not shown). Solder spheres 316 are then placed over the apertures 310, and a reflow operation performed. After the photoresist 308 is removed and the seed layer 306 etched, the resultant capped pillars remain standing as shown in FIG. 11. In this particular alternative, note that the height of the solder portion is much higher than in the embodiment shown in FIG. 9. These alternatives may be interspersed such that variable height pillars 212, 312 may be incorporated on a single wafer depending on the completed configuration desired.

Finally, a cross sectional view of a completely assembled package 400 is shown prepared in accordance with the method set forth above.

The method in accordance with the present disclosure may also be utilized with multiple layers of photoresist and or other resist type materials to create variations in the columnar structure and thereby in the solder paste volume and/or solder sphere diameter in order to achieve the desired pillar and solder dimensional parameters. Additionally, although the embodiments shown in FIGS. 1-12 illustrate pillar and photoresist heights and diameters that are the same, it is to be understood that they may be of different heights and diameters. Additionally, multiple photoresists 308 may be applied with different heights and diameters such that the pillars formed thereby will have different shapes than straight sidewalk as is shown.

Figure 13:
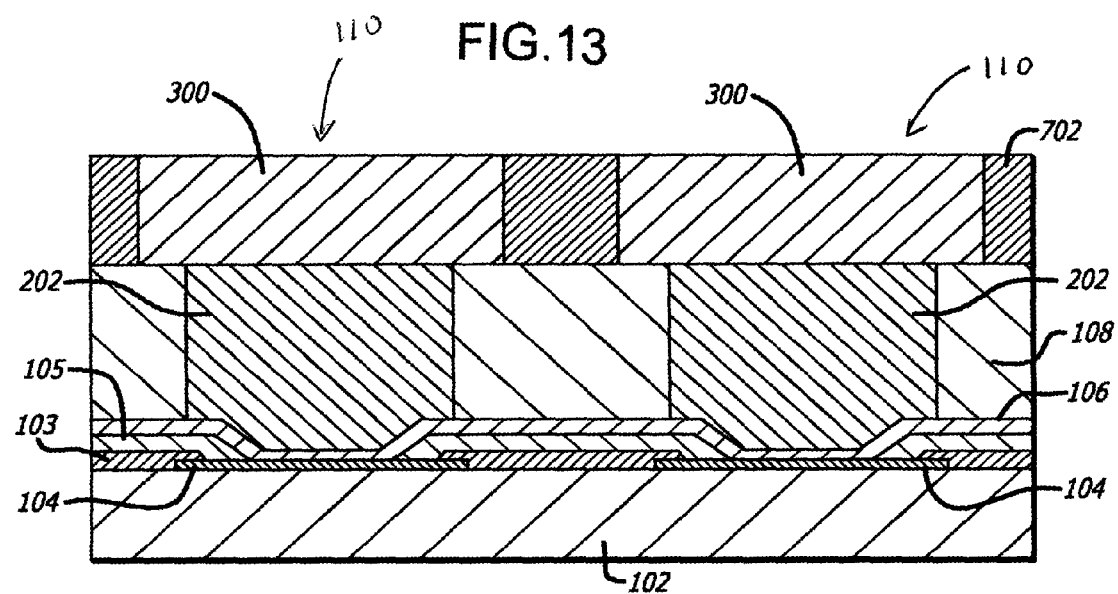
FIG. 13 illustrates a cross sectional view of an equivalent exemplary embodiment that includes using multiple layers of photoresist to create variations in columnar structure.

FIG. 13 illustrates an exemplary embodiment using one of many equivalent alternatives featuring multiple layers of photoresist (108, 702) and/or other resist-type materials to create variations in the columnar structure and in the solder volume in order to achieve the desired pillar and solder dimensional parameters, in accordance with at least one embodiment of the present disclosure. In other equivalent embodiments, photoresist layer 702 has a number of apertures with each aperture defining a dimension of a portion of solder paste 300 overlying a particular pillar 202. Each pillar 202 also has a dimension defined by a respective one of a number of apertures in photoresist layer 108. As a result, solder paste 300 has a greater lateral dimension than pillar 202. In other embodiments the height and aperture sizes in each of the photoresist layers 108 and 702 may be varied to adjust the relative volumes of pillar metal and overlying solder material as may be desired for a particular interconnect application.

Figure 14:
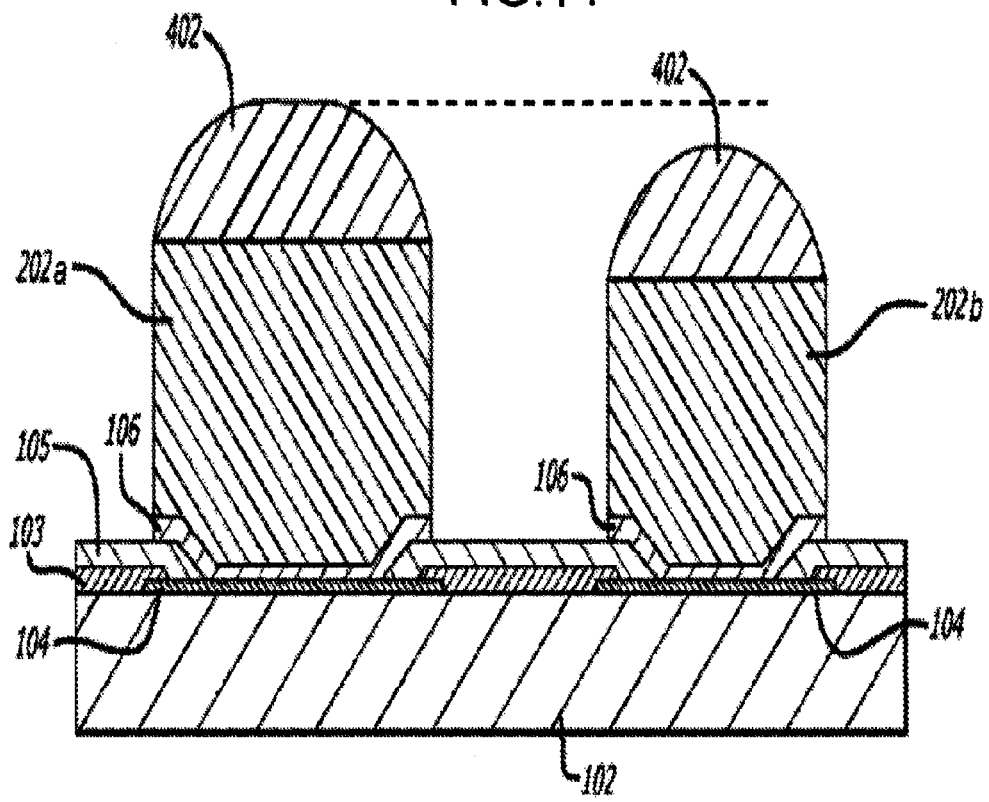
FIG. 14 illustrates a cross sectional view of an equivalent exemplary embodiment showing varying heights and widths of vertical pillars.

FIG. 14 illustrates another exemplary embodiment, which includes forming a first vertical pillar 202a and a second vertical pillar 202b each overlying a respective bond pad 104 (See FIGS. 1 and 2). At least the first and second pillars (202a, 202b) each has a different height. Each respective bond pad 104 overlies the semiconductor substrate 102, which is in turn overlaid by seed layer 106. At least one photoresist layer 108 is then deposited on the plated seed layer 106 and at least a first aperture and a second aperture 110 is formed in the at least one photoresist layer 108 (See FIGS. 1 and 2). Solder 402 is then applied on a top surface of each of the first and second pillars (202a, 202b), wherein the solder on the first pillar is defined by the first aperture and the solder on the second pillar is defined by the second aperture.

The exemplification set out herein illustrates particular embodiments, and such exemplification is not intended to be construed as limiting in any manner.

What is claimed is:

1. A method, comprising:
   forming a vertical pillar overlying or laterally displaced from a bond pad overlying a semiconductor substrate;
   applying a discrete solder sphere in combination with one of a solder paste or flux on a top surface of the pillar, wherein the one of the solder paste or flux is defined by at least one photoresist layer; and a passivation layer overlies the semiconductor substrate and has an opening to expose the bond pad, the method further comprising: prior to forming the vertical pillar, depositing a seed layer directly onto the passivation layer and the bond pad.

2. The method of claim 1, wherein the pillar is defined by the at least one photoresist layer.

3. The method of claim 2, further comprising forming a solder cap on top of the vertical pillar by performing a reflow subsequent to the applying the solder paste.

4. The method of claim 1, wherein:
   the at least one photoresist layer has a first aperture that is configured to define the solder paste or flux;
   the pillar is defined by a second aperture in an additional photoresist layer;
   the at least one photoresist layer is formed overlying the additional photoresist layer; and
   the first aperture has a greater lateral dimension than the second aperture.

5. The method of claim 1, wherein
   the discrete solder sphere and the solder paste are selected from the group consisting of a solder alloy and a single metal solder, and
   the solder paste is doped with at least one trace element.

6. The method of claim 5, wherein the at least one trace element is at least one of Bi, Ni, Sb, Fe, Al, In, and Pb.

7. The method of claim 1, wherein the discrete solder sphere and the solder paste are multi-element solder alloys.

8. The method of claim 1, further comprising,
   subsequent to the applying the one of the solder paste or flux, in combination with the discrete solder sphere, forming a solder cap on top of the vertical pillar by performing a reflow.

9. The method of claim 1, wherein the vertical pillar is one of a plurality of vertical pillars, and further comprising, prior to applying the solder paste or flux, planarizing the plurality of vertical pillars.

10. The method of claim 1, wherein the vertical pillar is one of a plurality of vertical pillars, and each of the plurality of vertical pillars corresponds to a variable height Z-axis interconnect.

11. The method of claim 1, wherein the vertical pillar is copper.

12. The method of claim 11, wherein the vertical pillar comprises a solder-wettable cap finish formed of one of Ni, NiAu, NiPdAu, NiPd, Pd, and NiSn.

13. The method of claim 1, wherein the vertical pillar is one of a silver and a silver alloy.

14. The method of claim 1, wherein the vertical pillar has a shape selected from one of the following: circular, rectangular, and octagonal.

15. The method of claim 1, wherein the discrete solder sphere and solder paste is a solder alloy or a single metal solder.

16. The method of claim 1, further comprising, prior to forming the vertical pillar, forming a seed layer overlying the bond pad.

17. The method of claim 16, further comprising, prior to forming the vertical pillar, forming the at least one photoresist layer overlying the seed layer.

18. The method of claim 1, further comprising:
   prior to forming the vertical pillar, forming a dielectric layer overlying the bond pad and exposing a portion of the bond pad by providing an opening in the dielectric layer; and
   forming a seed layer overlying the dielectric layer.

19. The method of claim 18, wherein the dielectric layer is a polymer layer.

20. The method of claim 1, further comprising defining an area using a metal stencil in which a portion of the solder paste is applied over both of the vertical pillar and the at least one photoresist layer.

21. The method of claim 1, wherein the at least photoresist layer comprises one or more photoresist layers, each of the one or more photoresist layers having an aperture of a common size.

22. The method of claim 1, wherein the applying the solder paste comprises printing a solder paste.

23. The method of claim 1, wherein applying the solder sphere comprises placing a preformed solder sphere.

24. A method, comprising:
   forming a vertical copper pillar overlying a bond pad, wherein the bond pad overlies a semiconductor substrate;
   applying a solder paste and a preformed solder sphere on top of the copper pillar, wherein the solder paste is defined by at least one photoresist layer, and the solder paste is doped with at least one trace element;
   forming a solder cap from the solder paste and the preformed sphere by performing a reflow; and a passivation layer overlies the semiconductor substrate and has an opening to expose the bond pad, the method further comprising: prior to forming the vertical copper pillar, depositing a seed layer directly onto the passivation layer and the bond pad.

25. The method of claim 24, wherein the vertical copper pillar comprises a solder-wettable cap finish formed of one of Ni, NiAu, NiPdAu, NiPd, Pd, and NiSn.

26. The method of claim 24, further comprising: prior to forming the vertical copper pillar, forming a seed layer overlying the bond pad; and
   prior to forming the vertical copper pillar, forming the at least one photoresist layer overlying the seed layer.

27. The method of claim 24, wherein the solder paste is Sn.

28. The method of claim 24, further comprising:
   prior to forming the vertical copper pillar, forming a dielectric layer overlying the bond pad and providing an opening in the dielectric layer to expose a portion of the bond pad; and
   forming a seed layer overlying the dielectric layer.

29. A method, comprising:
   forming first and second vertical pillars each overlying a respective bond pad, wherein the respective bond pad overlies a semiconductor substrate;
   forming at least one photoresist layer having a first aperture and a second aperture; and
   applying a solder paste and a preformed solder sphere on a top surface of at least one of the first and second pillars, wherein the solder paste on the first pillar is defined by the first aperture and the solder paste on the second pillar is defined by the second aperture;

performing a reflow to form a first solder cap on the first pillar and a second solder cap on the second pillar, wherein the combined height of the first pillar and first solder cap is greater than the combined height of the second pillar and second solder cap.

30. The method of claim 29, wherein the at least one photoresist layer is a single photoresist layer or a multi-layer photoresist stack.

31. The method of claim 29, wherein the combined height of the first pillar and first solder cap is greater than the combined height of the second pillar and second solder cap by at least about 5 microns.

\* \* \* \* \*